(12) United States Patent
Pachler et al.

(10) Patent No.: US 10,651,898 B2
(45) Date of Patent: May 12, 2020

(54) VERTICAL FERRITE ANTENNA INCLUDING PRE-FABRICATED CONNECTION MEMBERS

(71) Applicant: Infineon Technologies AG, Neubiberg (DE)

(72) Inventors: Walther Pachler, Graz (AT); Gottfried Beer, Nittendorf (DE); Juergen Hoelzl, Graz (AT); Juergen Schilling, Graz (AT); Harald Witschnig, Landskron (AT)

(73) Assignee: Infineon Technologies AG, Neubiberg (DE)

( * ) Notice: Subject to any disclaimer, the term of this patent is extended or adjusted under 35 U.S.C. 154(b) by 689 days.

(21) Appl. No.: 15/184,344

(22) Filed: Jun. 16, 2016

(65) Prior Publication Data
US 2017/0012355 A1  Jan. 12, 2017

(30) Foreign Application Priority Data
Jul. 8, 2015  (DE) .................. 10 2015 111 038

(51) Int. Cl.
*H01Q 7/06* (2006.01)
*H04B 5/00* (2006.01)
(52) U.S. Cl.
CPC ................. *H04B 5/0081* (2013.01)
(58) Field of Classification Search
CPC combination set(s) only.
See application file for complete search history.

(56) References Cited

U.S. PATENT DOCUMENTS

| 3,683,389 A * | 8/1972 | Hollis | H01Q 7/005 343/742 |
| 5,476,394 A * | 12/1995 | Sugihara | H01Q 7/06 439/34 |
| 5,567,537 A * | 10/1996 | Yoshizawa | G06K 19/07749 428/800 |

(Continued)

OTHER PUBLICATIONS https://de.wikipedia.org/wiki/index/php?title=Antennentechnik&oldid=143595043, updated Jun. 29, 2015.

*Primary Examiner* — Graham P Smith
*Assistant Examiner* — Jae K Kim
(74) *Attorney, Agent, or Firm* — Dicke, Billig & Czaja, PLLC

(57) ABSTRACT

A ferrite antenna is disclosed. The ferrite antenna includes a ferrite core a first main face, a second main face opposite to the first main face, and side faces connecting the first and second main faces. A first plurality of conductor wires are disposed at the first main face of the ferrite core; a second plurality of conductor wires disposed at the second main face of the ferrite core. A first connection member is disposed at a first side face of the ferrite core, the first connection member including a first plurality of connection wires; and a second connection member is disposed at a second side face of the ferrite core, the second connection member including a second plurality of connection wires; wherein the first and second pluralities of conductor wires and the first and second plurality of connection wires are interconnected in such a way that they form an antenna coil, wherein the ferrite core is disposed in the interior space of the antenna coil.

14 Claims, 17 Drawing Sheets

(56) References Cited

U.S. PATENT DOCUMENTS

| | | | | |
|---|---|---|---|---|
| 5,966,641 | A | * | 10/1999 | Flowerdew .............. H01Q 7/00 343/867 |
| 6,014,111 | A | * | 1/2000 | Johannessen ............ H01Q 7/06 343/748 |
| 2002/0113747 | A1 | * | 8/2002 | Tessier ................ G06K 19/0723 343/787 |
| 2005/0110700 | A1 | * | 5/2005 | Terry ................. G06K 19/0723 343/841 |
| 2007/0040643 | A1 | * | 2/2007 | Inoue ................... H01F 17/045 336/213 |
| 2007/0126650 | A1 | * | 6/2007 | Guenther ................ H01Q 7/06 343/788 |
| 2008/0036687 | A1 | * | 2/2008 | Bergman ................. H01Q 1/40 343/895 |
| 2010/0163630 | A1 | | 7/2010 | Ochi et al. |
| 2012/0025939 | A1 | * | 2/2012 | Yamaguchi .......... H01Q 1/2216 336/105 |
| 2012/0081257 | A1 | * | 4/2012 | Yosui ................... H01Q 1/2225 343/788 |
| 2012/0098711 | A1 | * | 4/2012 | Yosui ................. G06K 7/10336 343/702 |
| 2014/0043196 | A1 | * | 2/2014 | Gouchi .................... H01Q 7/06 343/788 |
| 2014/0176384 | A1 | * | 6/2014 | Yosui ....................... H01Q 7/06 343/788 |
| 2015/0022307 | A1 | * | 1/2015 | Yokoyama .............. H01F 5/003 336/200 |
| 2015/0136499 | A1 | * | 5/2015 | Ichikawa .............. B60L 11/182 180/54.1 |
| 2015/0155629 | A1 | * | 6/2015 | Yagi ........................ H01Q 7/06 343/788 |
| 2015/0188228 | A1 | | 7/2015 | Yosui |
| 2016/0365636 | A1 | * | 12/2016 | Cobos Reyes ........... H01Q 7/06 |

* cited by examiner

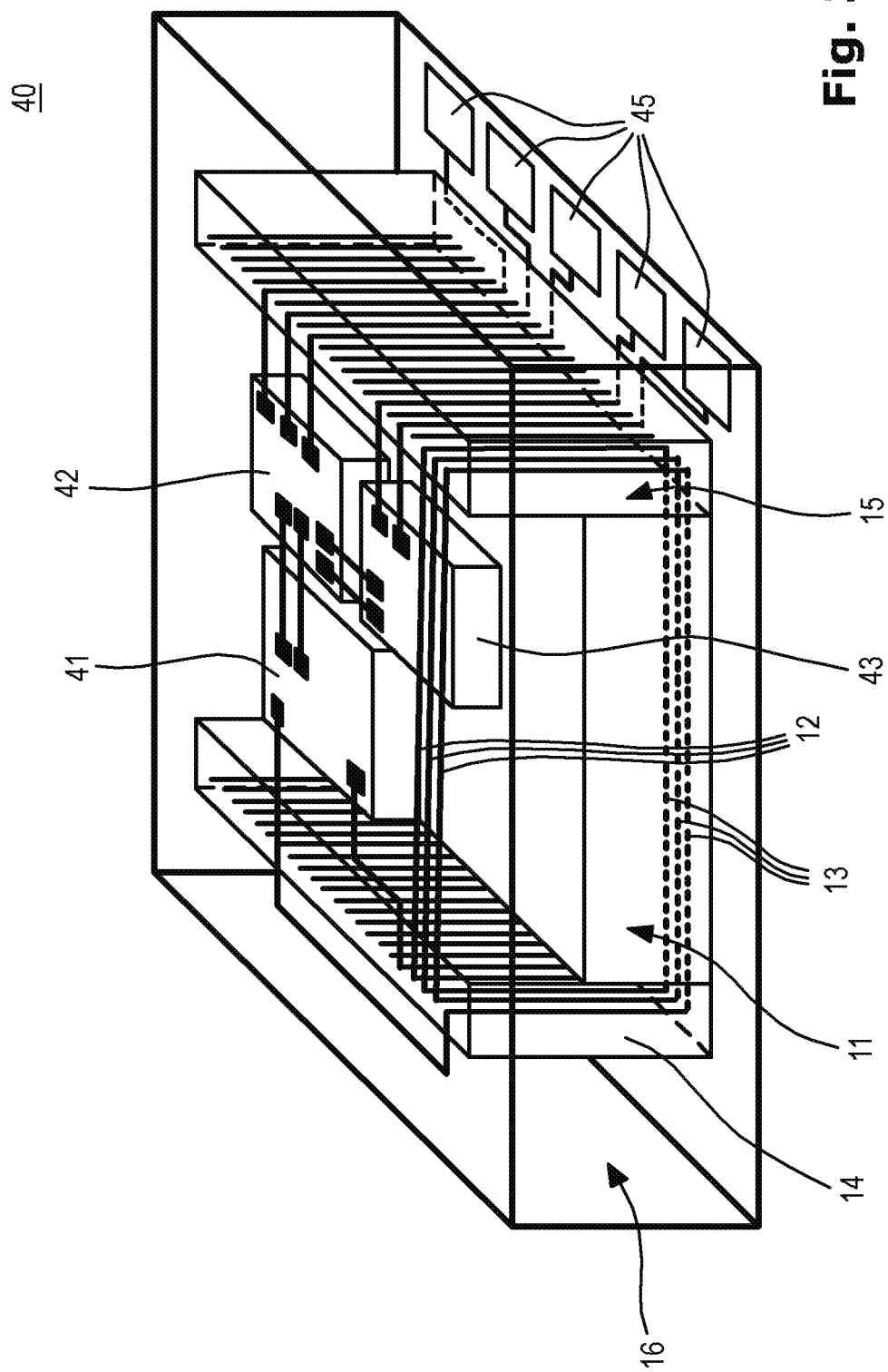

VERTICAL FERRITE ANTENNA INCLUDING PRE-FABRICATED CONNECTION MEMBERS

CROSS-REFERENCE TO RELATED APPLICATION

This Utility Patent Application claims priority to German Patent Application No. 10 2015 111 038.5, filed Jul. 8, 2015; and which is incorporated herein by reference.

TECHNICAL FIELD

The present application relates to a ferrite antenna, an electronic device package including a ferrite antenna, and a method for fabricating an electronic device package.

BACKGROUND

In the last decades more and more mobile devices like, for example, smartphones, tablets, or laptops, have been equipped with the Near Field Communication (NFC) technology. The NFC technology is used in short range applications such as ticketing, payment, and peering of two devices. In NFC a reader device communicates with a transponder (tag) device by inductive coupling. Two coils, one of the reader device and one of the tag, are inductively coupled via a magnetic field. Metal objects in the close vicinity of the devices deteriorate the performance of this coupling mechanism. Eddy currents are induced in the metal environment and generate an opposite oriented magnetic field that weakens the field of the reader device.

BRIEF DESCRIPTION OF THE DRAWINGS

FIG. 1 including

FIG. 2 including

FIG. 3 shows a schematic perspective representation of a ferrite antenna according to an example.

FIG. 4 including

FIG. 5 including

FIG. 6 including

FIG. 7 including

FIG. 8 including

FIG. 9 including

DETAILED DESCRIPTION

Figure 1A:
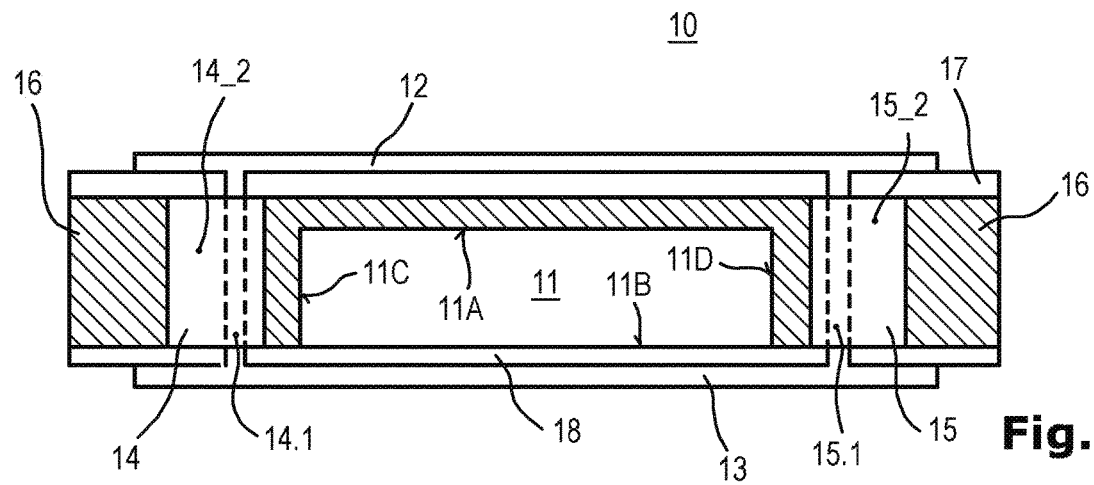
FIGS. 1A, 1B and 1C shows schematic cross-sectional side view (A), top view (B), and perspective (C) representations of a ferrite antenna according to an example.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part hereof, and in which is shown by way of illustration specific aspects in which the invention may be practiced. In this regard, directional terminology, such as "top", "bottom", "front", "back", etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

In the following ferrite antennas and electronic device packages are described below. An electronic device package contains a ferrite antenna and may also contain one or more semiconductor chips. The semiconductor chips may be of different types, may be manufactured by different technologies and may include RF chips, RFID chips, or for example integrated electrical, electro-optical or electro-mechanical circuits and/or passives. The semiconductor chips may, for example, be designed as logic integrated circuits, analog integrated circuits, mixed signal integrated circuits, power integrated circuits, memory circuits or integrated passives. They may include control circuits, microprocessors or microelectromechanical components. Further, they may be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the electronic device packages described below may include integrated circuits to control the integrated circuits of other semiconductor chips, for example the integrated circuits of power semiconductor chips. The semiconductor chips can be manufactured on the basis of a specific semiconductor material, for example Si, SiC, SiGe, GaAs, GaN, AlGaAs, but can also manufactured on the basis of any other semiconductor material and, furthermore, may contain inorganic and/or organic materials that are not semiconductors, such as for example insulators, plastics or metals.

The examples of a ferrite antenna and of an electronic device package may include an encapsulant or encapsulating material for embedding the semiconductor chip or other insulating or dielectric materials. These encapsulating, insulator or dielectric materials can be any electrically insulating material like, for example, any kind of molding material, any kind of resin material, or any kind of epoxy material. The mentioned materials can also comprise one or more of a polymer material, a polyimide material, a thermoplast material, a silicone material, a ceramic material, and a glass material. The mentioned materials may also comprise any of the above-mentioned materials and further include filler materials embedded therein like, for example, thermally conductive increments. These filler increments can be made of AlO or $Al_2O_3$, AlN, BN, or SiN, for example. Furthermore the filler increments may have the shape of fibers and can be made of carbon fibers or nanotubes, for example. After its deposition the encapsulant, for example, may be only partially hardened and may be completely hardened after application of energy (e.g. heat, UV light, etc.) to form an encapsulant. Various techniques may be employed to cover the semiconductor chips with the encapsulant, for example one or more of compression molding, transfer molding, injection molding, power molding, liquid molding, dispensing or laminating.

Figure 1B:
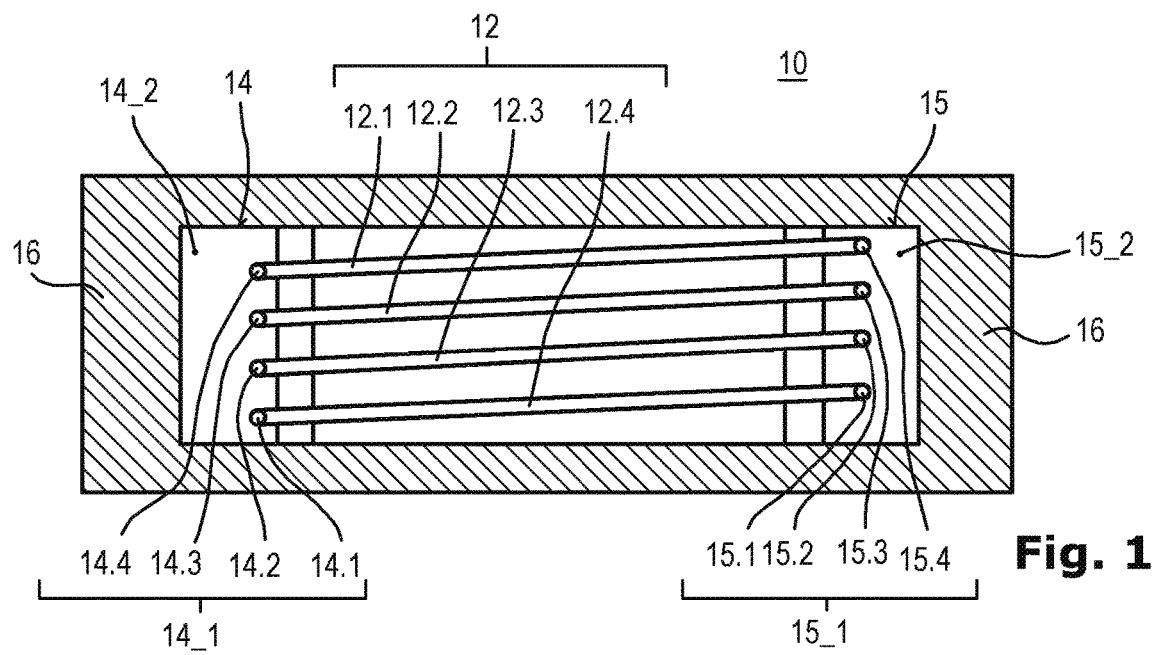
Figure 1C:
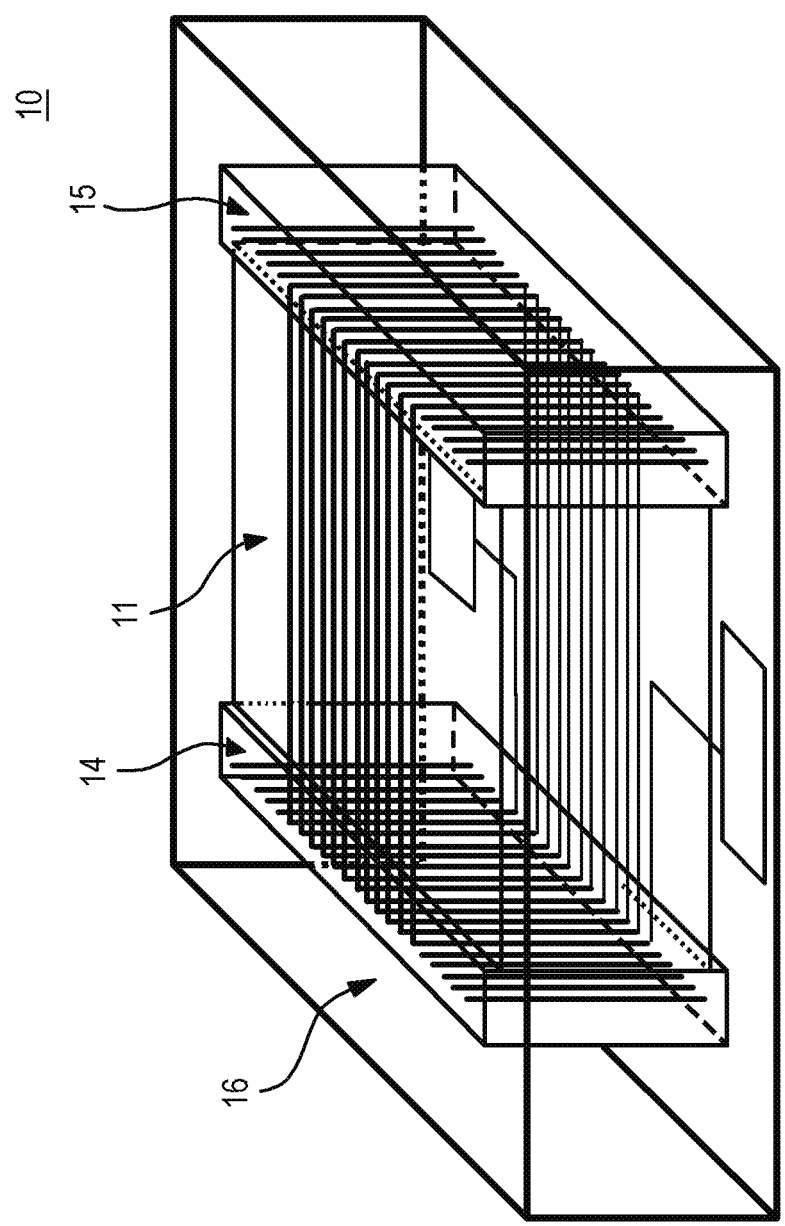

FIG. 1 including FIGS. 1A, 1B and 1C depicts a ferrite antenna according to an example. The ferrite antenna 10 of FIG. 1 includes a ferrite core 11 including a first main face 11A, a second main face 11B opposite to the first main face 11A, and side faces 11C and 11D connecting the first and second main faces 11A and 11B. The ferrite antenna 10 of FIG. 1 further includes a first plurality 12 of conductor wires 12.1-12.4 disposed at or above the first main face 11A of the ferrite core 11, a second plurality 13 of conductor wires disposed at or above the second main face 11B of the ferrite core 11, a first connection member 14 disposed at a first side face 11C of the ferrite core 11, the first connection member 14 including a first plurality 14_1 of connection wires 14.1-14.4, and a second connection member 15 disposed side face 11D of the ferrite core 11, the second connection member 15 including a second plurality 15_1 of connection wires 15.1-15.4. The first and second pluralities 12 and 13 of conductor wires 12.1-12.4 and 13.1-13.4 and the first and second pluralities 14_1 and 15_1 of connection wires 14.1-14.4 and 15.1-15.4 are interconnected in such a way that they form an antenna coil, wherein the ferrite core 11 is disposed in the interior space of the antenna coil.

The cross-sectional representation of FIG. 1A could, for example, be taken from connection wire 14.1 on the left along conductor wire 12.1 to connection wire 15.1 on the right.

According to an example of the ferrite antenna 10 of FIG. 1, the first connection member 14 includes an encapsulation body 14_2, wherein the connection members 14.1-14.4 are in a broad sense attached to the encapsulation body 14_2. In the example as shown in FIG. 1 the connection wires 14.1-14.4 are formed as through-connections through the encapsulation body 14_2. According to another example the connection wires can also be formed as connection lines on a surface of the encapsulation body. The same holds true for the second connection member 15 and the connection wires 15.1-15.4. According to a further example thereof, the encapsulation bodies 14_2 or 15_2 may comprise an encapsulation material, the encapsulation material including one or more of a polymer, a resin, an epoxy-resin, a duroplast, a thermoplast, a ceramic, and a laminate.

According to an example of the ferrite antenna 10 of FIG. 1, the first and second connection members 14 and 15 are introduced as pre-fabricated elements during the fabrication process of the ferrite antenna. A specific example thereof will be presented later.

According to an example of the ferrite antenna 10 of FIG. 1, each one of the first and second connection members 14 and 15 are cube-shaped or cuboid-shaped.

According to an example of the ferrite antenna 10 of FIG. 1, the ferrite antenna 10 can be embedded within an encapsulation body 16.

According to an example of the ferrite antenna 10 as shown in FIG. 1C, the first connection member 14 is directly attached to the first side face 11C of the ferrite core 11, and the second connection member 15 is directly attached to the second side face 11D of the ferrite core 11.

According to an example of the ferrite antenna 10 as shown in FIGS. 1A and 1B, the first connection member 14 is disposed in a spatial distance from the first side face 11C of ferrite core 11, and the second connection member 15 is disposed in a spatial distance from the second side face 11D of the ferrite core 11. According to a further example thereof, an intermediate space between the ferrite core 11 and the first and second connection members 14 and 15 is filled with an encapsulation material which is equal to or different from an encapsulation material of the first and second connection members 14 and 15. The encapsulation material filled into the intermediate spaces can be the same as the encapsulation material of the encapsulation body 16.

According to an example of the ferrite antenna 10 of FIG. 1, a first dielectric layer 17 is disposed above the connection members 14 and 15 and the ferrite core 11 and below the conductor wires 12. The first dielectric layer 17 includes openings located directly above the connection wires 14.$i$ and 15.$i$ (i=1, . . . , 4) in order to allow electrical connection between the conductor wires 12 and the connection wires 14.$i$ and 15.$i$. In the example as shown in FIG. 1A the upper surface 11A of the ferrite core 11 is spaced apart from the first dielectric layer 17 and encapsulation material 16 is filled in the intermediate space. Alternatively there can also be a direct connection between the upper face 11A of the ferrite core 11 and the first dielectric layer 17.

According to an example of the ferrite antenna 10 of FIG. 1, a second dielectric layer 18 can be disposed below the lower surface 11B of the ferrite core 11 and, for example, in direct connection with the lower surface 11B. Besides that the second dielectric layer 18 can have the same configuration as the first dielectric layer 17, in particular openings formed in the second dielectric layer 18 at locations directly below the connection wires 14.$i$ and 15.$i$ (i=1, . . . , 4) in order to allow electrical connection between the conductor wires 13 and the connection wires 14.$i$ and 15.$i$.

According to an example of the ferrite antenna 10 of FIG. 1, each one of the first plurality of conductor wires 12 is connected with one or more than one of the first plurality 14_1 of connection wires 14.1-14.4 and one or more of the second plurality 15_1 of connection wires 15.1-15.4. Such an example is shown in FIG. 1C. The example of FIG. 1C further shows that a part of the first plurality 14_1 of connection wires is not connected with either one of the conductor wires of the first and second plurality of conductor wires 12 and 13, and likewise a part of the second plurality 15 of connection wires is not connected with either one the conductor wires of the first and second plurality of conductor wires 12 and 13.

Figure 2A:
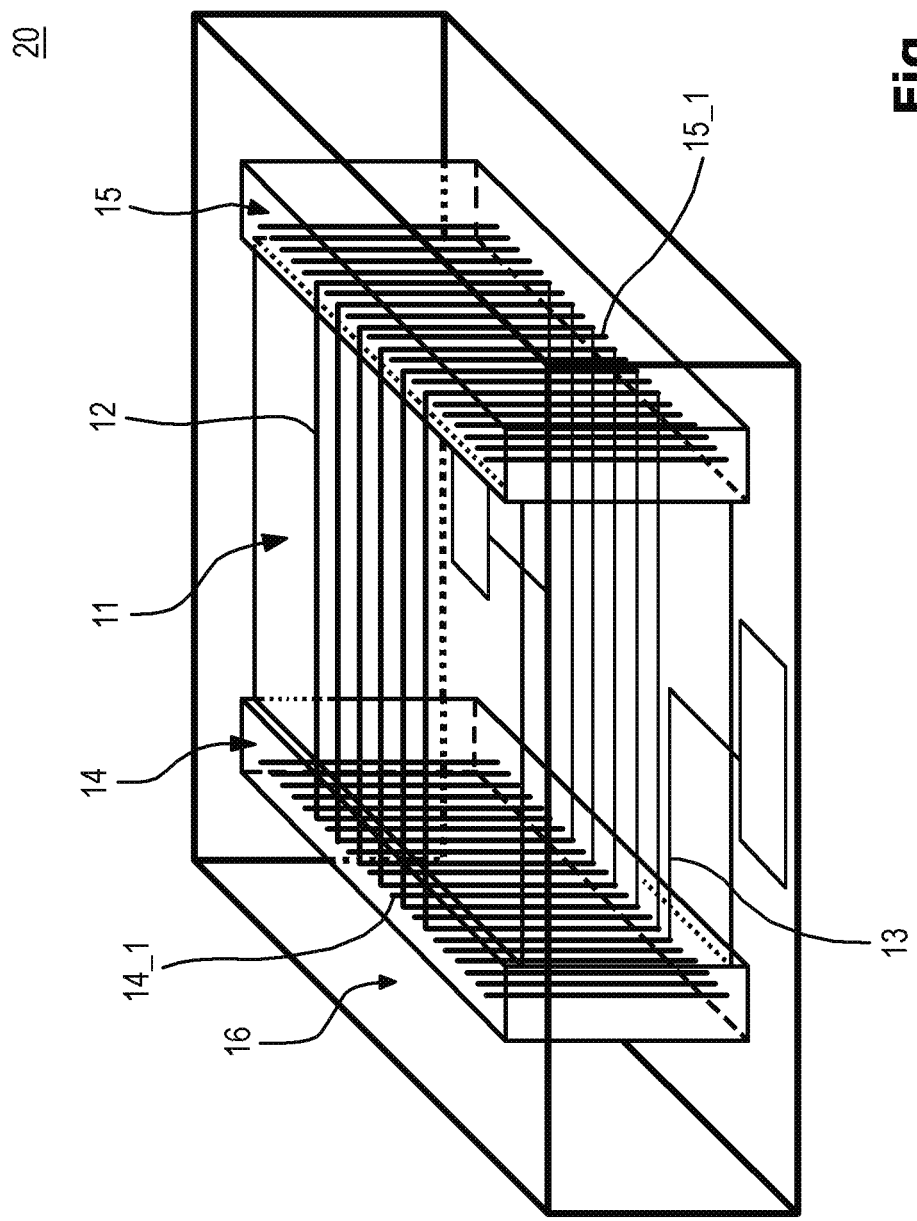
FIGS. 2A and 2B shows schematic perspective representations of a ferrite antenna according to an example, respectively.
Figure 2B:
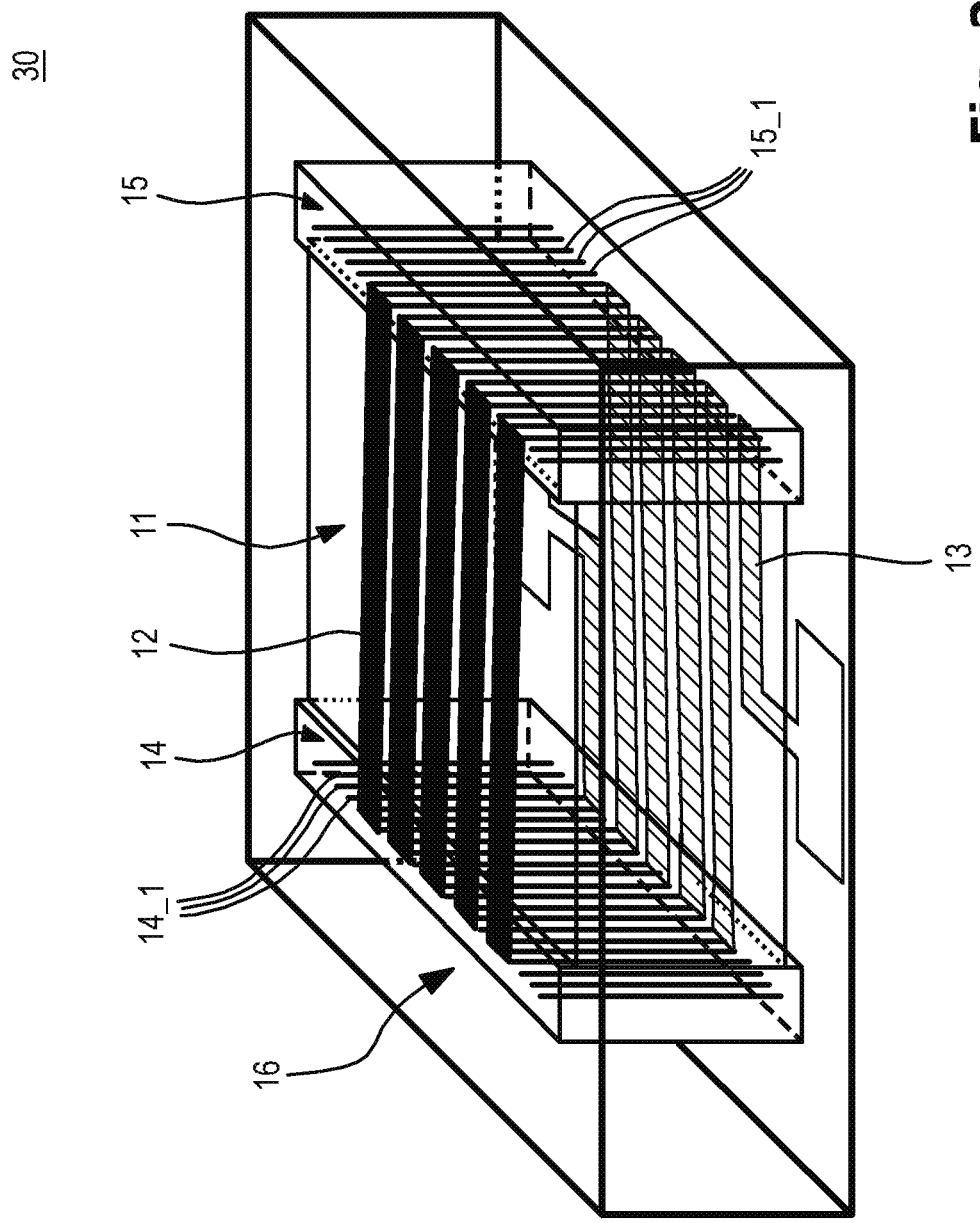

FIG. 2 includes FIGS. 2A and 2B and shows further examples of ferrite antennas. The examples of ferrite antennas 20 and 30 depicted in FIGS. 2A and 2B differ from the example as shown in FIG. 1C in the way of connecting the conductor wires 12 and 13 to the connection wires 14 and 15. Both examples shown in FIGS. 2A and 2B depict a ferrite antenna 20 and 30 in which a part of the first plurality of connection wires 14 is not connected with either one of the conductor wires of the first and second pluralities 12 and 13 of conductor wires, and a part of the second plurality of connection wires 15 is not connected with either one of the conductor wires of the first and second pluralities of conductor wires 12 and 13.

FIG. 2A shows an example of a ferrite antenna 20 in which only every second one of the connection wires 14 is connected with one of the conductor wires 12 and one of the conductor wires 13. Likewise only every second one of the connection wires 15 is connected with one of the conductor wires 12 and one of the conductor wires 13.

FIG. 2B shows an example of a ferrite antenna 30 in which the conductor wires 12 are wider than in the previous examples and each one of the conductor wires 12 is connected with three connection wires 14_1 of the first plurality of connection wires and likewise three connection wires 15_1 of the second plurality of connection wires. Also the second conductor wires 13 are as wide as the first conductor wires.

FIG. 3 depicts a further example of a ferrite antenna 40. The difference to the previously shown examples is that within the package containing the ferrite antenna also one or more semiconductor chips are enclosed. The present example shows three semiconductor chips 41, 42 and 43 disposed above the first, upper surface of the ferrite core 11. The chips 41-43 may be interconnected with each other and may, for example, comprise a micro-controller chip 43, an RF or RFID chip 42, and an RF matching component chip 41 which is connected with the vertical antenna including first conductor wires 12 and second conductor wires 13 disposed in the foreground of the ferrite antenna 40. Each one of the chips 41-43 may comprise contact pads at an upper surface thereof. The micro-controller chip 41 and the RF chip 42 may be connected with their contact pads to external contact pads 45 by utilizing single ones of the connection wires 15.$i$ of the second connection member 15. The RF matching components chip 41 includes two contact pads each one of which is connected with one of the ends of the antenna coil of the vertical antenna, in particular one of the contact pads is connected with an outermost one of the connection wires 14.$i$ and the other contact pad is connected with the 5th one of the connection wires 14.$i$.

FIG. 4 including FIG. 4A-4G now illustrates the method of fabricating a ferrite antenna according to FIG. 1. According to FIG. 4A a double-sided sticky tape 2 is applied onto a temporary metal carrier 1 and thereafter a ferrite core 11 is attached to the double-sided sticky tape 2. As mentioned previously, the first and second connection members 14 and 15 are separately fabricated and attached to the double-sided sticky tape on either sides of the ferrite core 11. The first and second connection members 14 and 15 are pre-fabricated in such a way that they each include a plurality of connection wires 14.$i$ and 15.$i$, respectively. Each one of the first and second connection members 14 and 15 basically includes an encapsulation or mold body 14_2 and 15_2, wherein the connection wires 14.$i$ and 15.$i$ are fabricated in the form of through-connections through the mold body, respectively. The first and second connection members 14 and 15 are placed onto the double-sided sticky tape 2 in a spaced relationship to the ferrite core 11, each one on one of the sides of the ferrite core.

According to an example of the method, a plurality of ferrite cores 11 are placed onto the double-sided sticky tape 2 together with first and second connection members 14 and 15 in a spaced relationship in order to produce a respective plurality of electronic device packages.

Figure 4A:
FIGS. 4A-4G shows schematic cross-sectional side view representations for illustrating a method for fabricating a ferrite antenna according to an example.
Figure 4B:
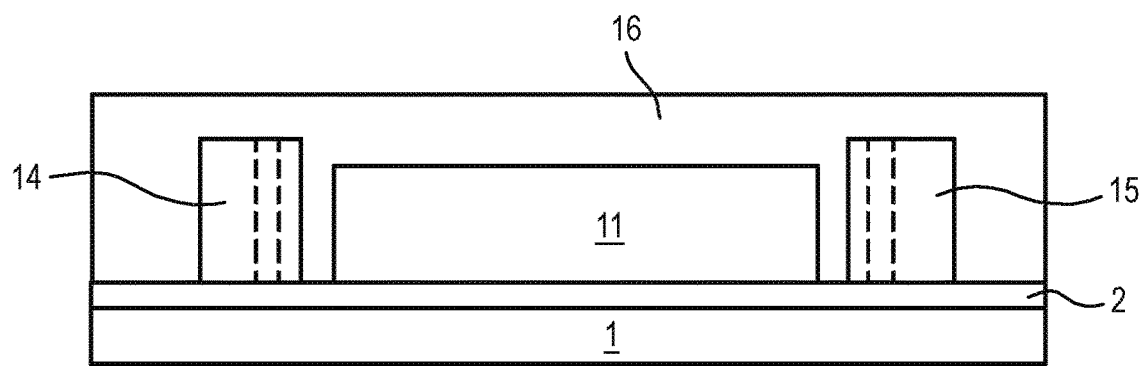

According to FIG. 4B, an encapsulation material 16 is applied over the plurality of ferrite cores 11 and first and second connection members 14 and 15. According to an example, the encapsulation material 16 is applied using a molding process such as compression molding, transfer molding, injection molding, granulate molding, powder molding, liquid molding, as well as printing processes such as stencil or screen printing.

According to examples, the encapsulation material 16 includes a dielectric material and may comprise a mold compound according to one example. The encapsulation material 16 may also comprise one or more of a polymer, a copolymer, a biopolymer, a fiber impregnated polymer (e.g. carbon or glass-fibers in a resin), a particle filled polymer, and other organic materials. The encapsulation material 16 may also be made of any appropriate duroplastic, thermoplastic, thermosetting material, or a laminate. The encapsulation material 16 may include filler materials like, for example, small particles of glass or other electrically insulating mineral filler materials like alumina or organic filler materials. The encapsulation material 16 may be cured, i.e. subjected to a thermal process to harden, thus forming a single substrate holding the plurality of ferrite cores 11 and first and second connection members 14 and 15. Such a substrate is often referred to as a reconstituted wafer. The form of the substrate is not limited to a wafer and can also have a quadratic or rectangular shape.

Figure 4C:
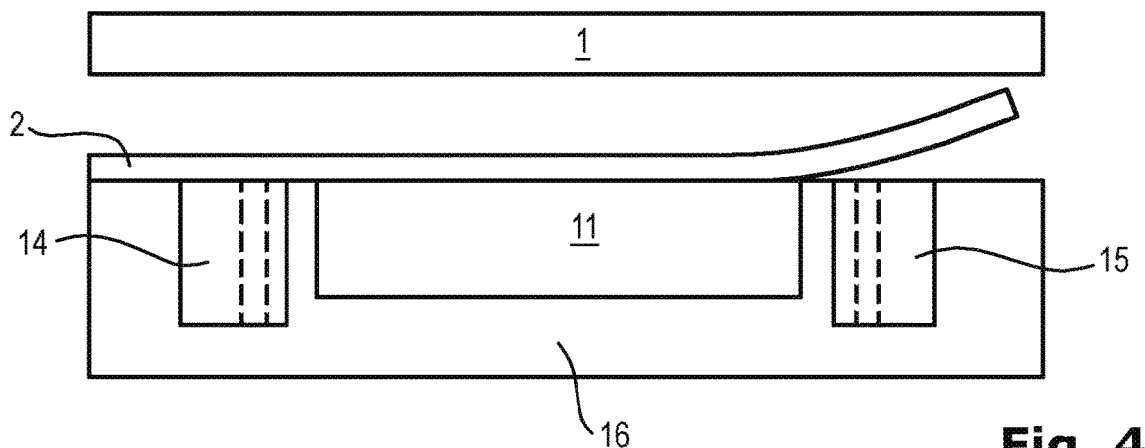

According to FIG. 4C, after hardening of the encapsulation material 16, the carrier 1 and the double-sided sticky tape 2 are removed resulting in a reconstituted wafer held together and stabilized by the hardened encapsulation material 16.

Figure 4D:
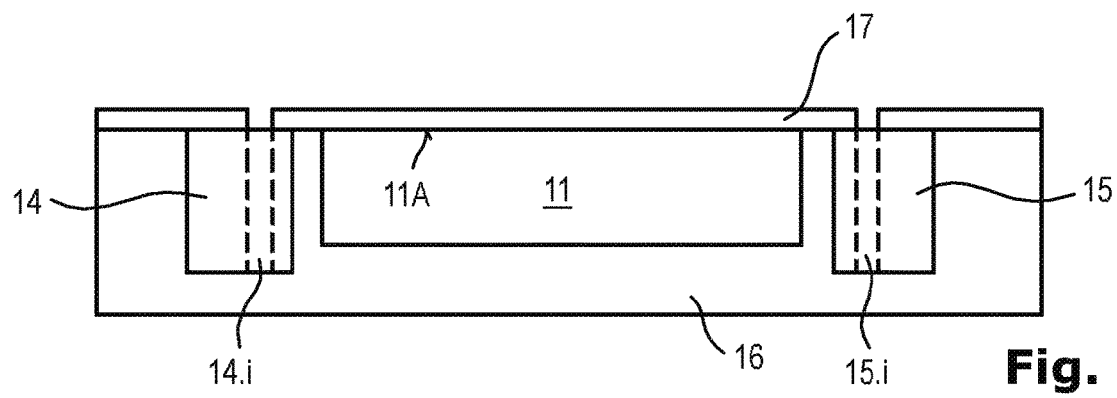

According to FIG. 4D, a first dielectric layer 17 is applied onto an upper main face of the panel thereby covering a first upper main face 11A of the ferrite core 11. The first dielectric layer 17 is applied in such a way that it includes openings 14.*i* and 15.*i* which are located directly above the connection wires 14.*i* of the first connection member 14 and the connection wires 15.*i* of the second connection member 15. This can be done, for example, by applying the first dielectric layer 17 and thereafter generate the openings by a laser-drilling process or by a photo-lithography and etching process.

Figure 4E:
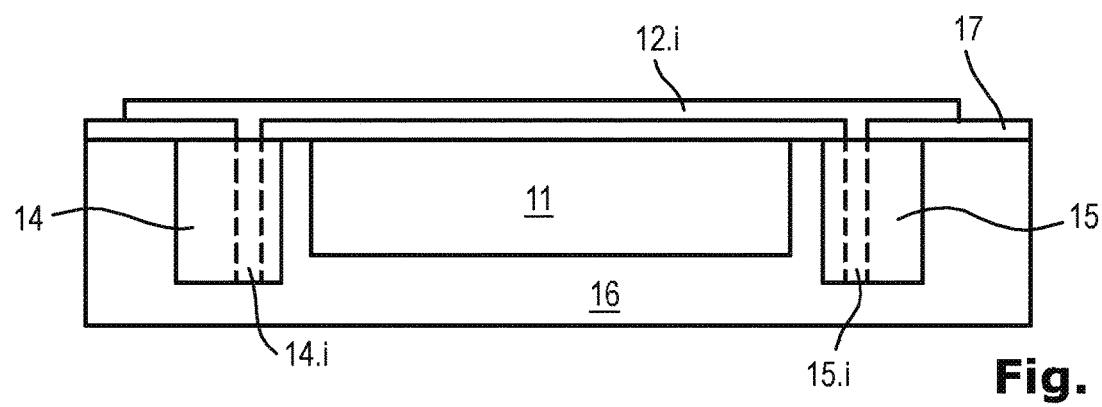

According to FIG. 4E, a plurality of conductor wires 12.*i* is deposited as shown, for example, in FIG. 1B. The conductor wires 12.*i* are deposited in such a way that they connect the first connection wires 14.*i* with the second connection wires 15.*i*, respectively. Depositing the conductor wires 12.*i* can be performed by, for example, galvanic plating in which case a seed layer (not shown) would have to be deposited beforehand. The conductor wires 12.*i* could also be deposited by another process like, for example, electroless plating or sputtering. For forming the conductor wires 12.*i*, at first a contiguous metallic layer can be deposited onto the upper main face of the panel and thereafter a structuring process can be performed by, for example, photo-lithography and etching or by a lift-off processing. It is also possible to form the conductor wires 12.*i* by depositing the metallic material through a shadow mask so that no after-structuring would be necessary.

Figure 4F:
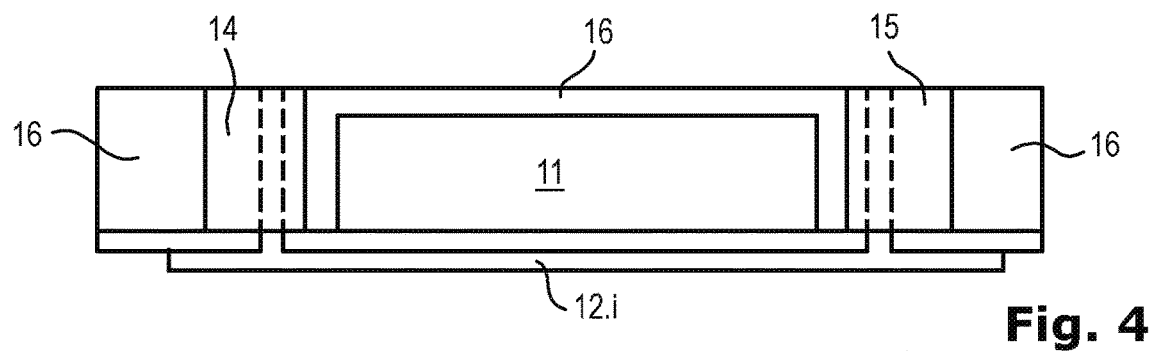

According to FIG. 4F, the lower main face of the panel is removed by, for example, polishing, chemical-mechanical polishing (CMP) or grinding until the respective lower surfaces of the first and second connection members 14 and 15 and thus also the respective lower surfaces of the connection wires 14.*i* and 15.*i* are reached. FIG. 4F shows the resulting panel in an upside-down representation.

Figure 4G:
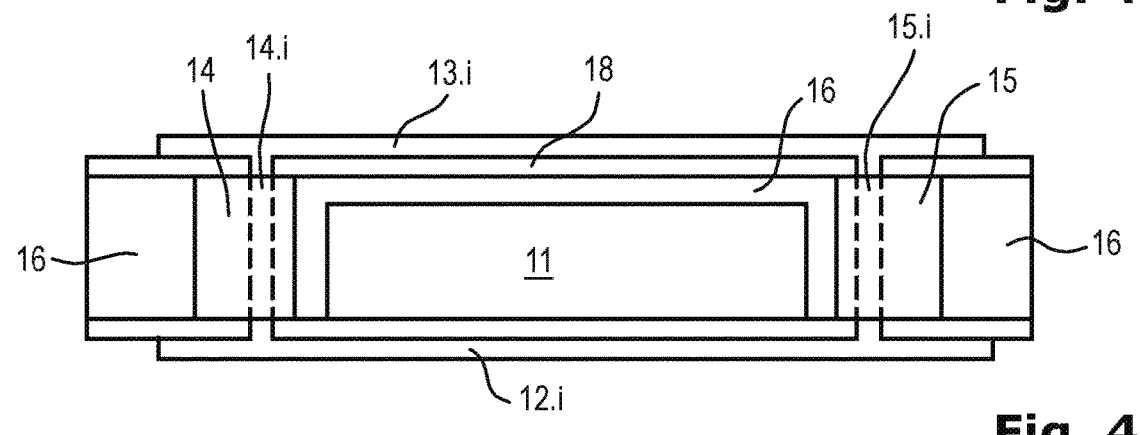

According to FIG. 4G, a second dielectric layer 18 is deposited on the now upper main face of the panel in the same way as it was described before in connection with the first dielectric layer 17. Thereafter second conductor wires 13.*i* are deposited onto the second dielectric layer 18 in the same way as described before in connection with the first conductor wires 12.*i*, i.e. so that they also connect connection wires 14.*i* and 15.*i* with each other, respectively. Thereafter the panel is singulated to obtain a plurality of ferrite antennas embedded in electronic device packages.

Figure 5A:
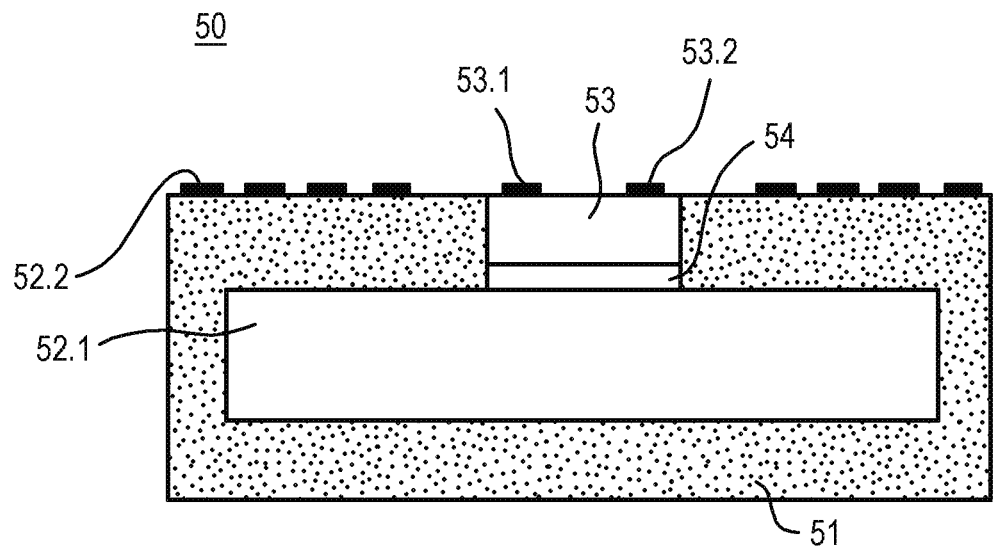
FIGS. 5A and 5B shows schematic cross-sectional side view (A) and perspective (B) representations of a ferrite antenna according to an example.
Figure 5B:
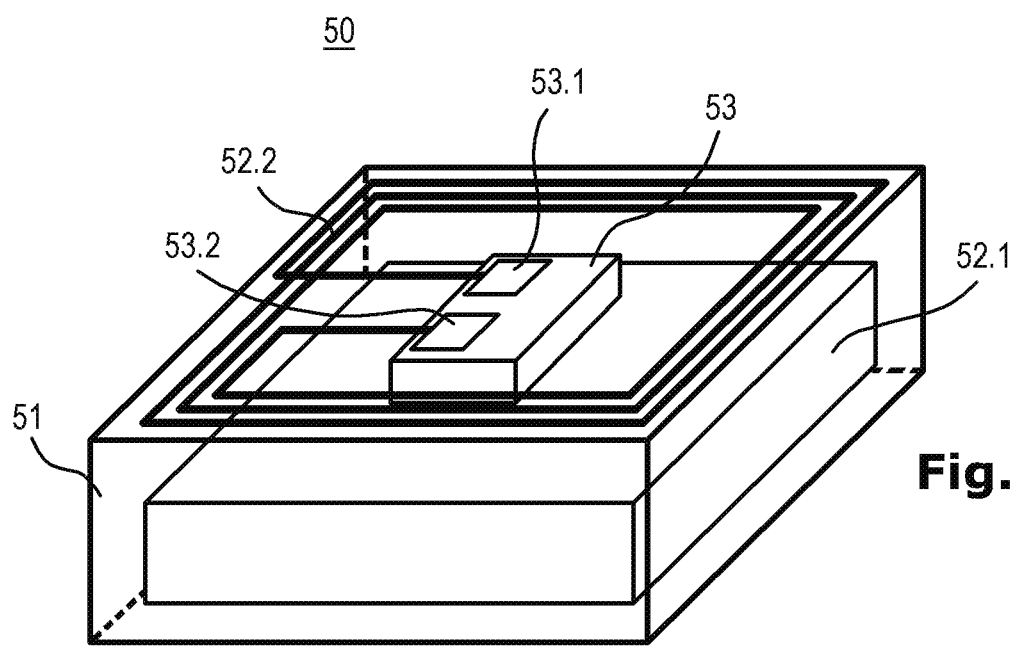

FIG. 5 including FIGS. 5A and 5B depict an example of an electronic device package including a ferrite antenna. The electronic device package 50 of FIG. 5 includes an encapsulation body 51, and a ferrite antenna 52 disposed in the encapsulation body 51. The ferrite antenna 52 includes a ferrite core 52.1 and an antenna coil 52.2 disposed above an upper main face of the ferrite core 52.1. In the present example the antenna coil 52.2 is disposed on an upper main face of the encapsulation body 51. Moreover, a semiconductor chip 53 is disposed on an upper main face of the ferrite core 52.1 by means of an adhesive layer 54. The semiconductor chip 53 can be an RF chip or an RFID chip. The semiconductor chip 53 includes two contact pads 53.1 and 53.2 each one of which is connected with an end of the antenna coil 52.2. The antenna coil extends only on the upper main face of the encapsulation body 51.

FIG. 6 including FIG. 6A-6H illustrates a method for fabricating an electronic device package such as that of FIG. 5 according to an example.

Figure 6A:
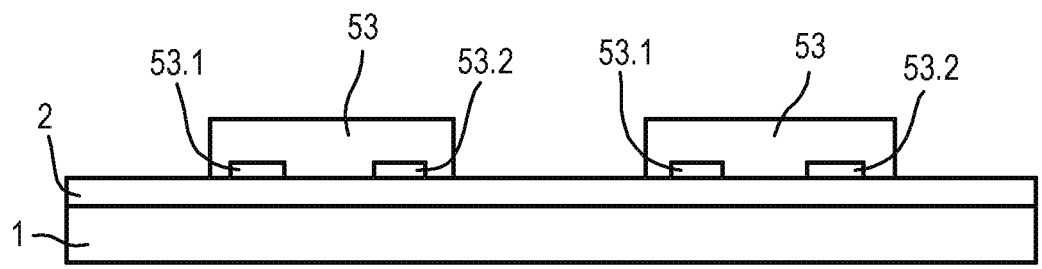
FIGS. 6A-6H shows schematic cross-sectional side view representations for illustrating a method for fabricating a ferrite antenna according to an example.

According to FIG. 6A, a double-sided sticky tape 2 is applied to an auxiliary carrier 1 and thereafter a plurality of RF chips 53 are attached to the double-sided sticky tape 2 with their contact pads 53.1 and 53.2 facing the double-sided sticky tape 2.

Figure 6B:
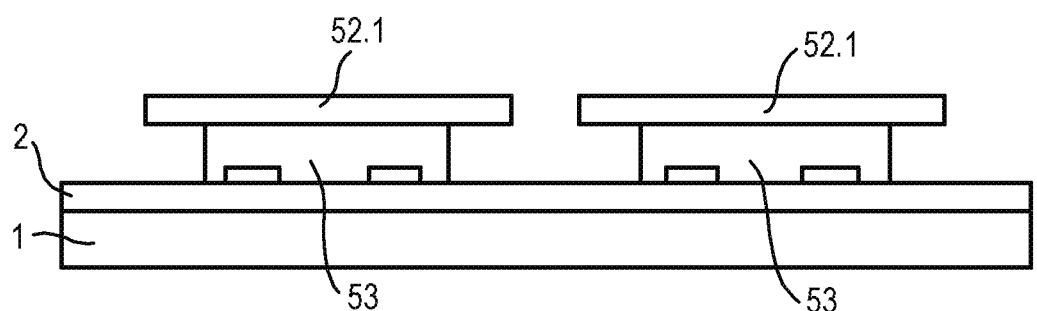

According to FIG. 6B, a ferrite core 52.1 is attached to an upper main face of the RF chip 53. The ferrite core 52.1 preferably includes a cubic or cuboid shape.

Figure 6C:
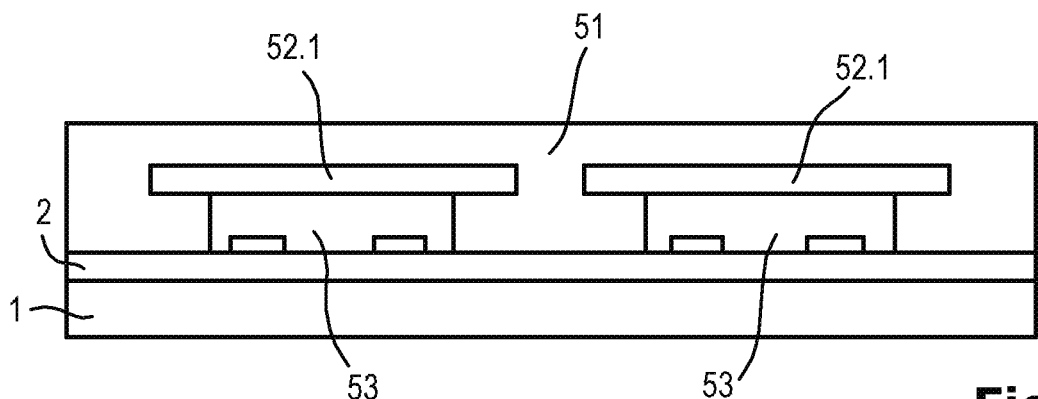

According to FIG. 6C, an encapsulation material 51 is applied onto the double-sided sticky tape 2 and the entire plurality of the RF chips 53 and ferrite cores 52.1.

Figure 6D:
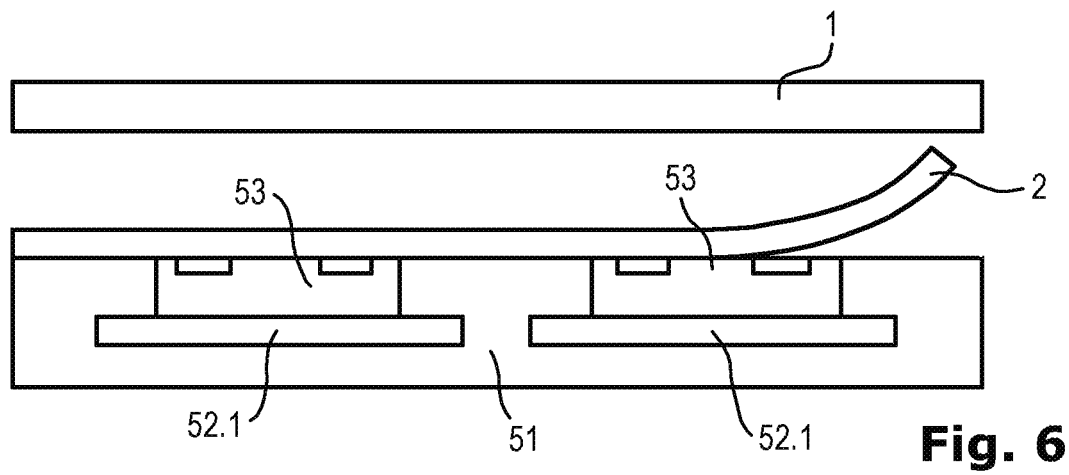

According to FIG. 6D, after hardening of the encapsulation material 51 the double-sided sticky tape 2 and the auxiliary carrier 1 are removed. As a result, one obtains a reconstituted wafer containing a plurality of RF chips 53 and ferrite cores 52.1 held together and stabilized by the hardened encapsulation material 51. The reconstituted wafer may comprise the form of a classical wafer but also a quadratic or rectangular shape.

Figure 6E:
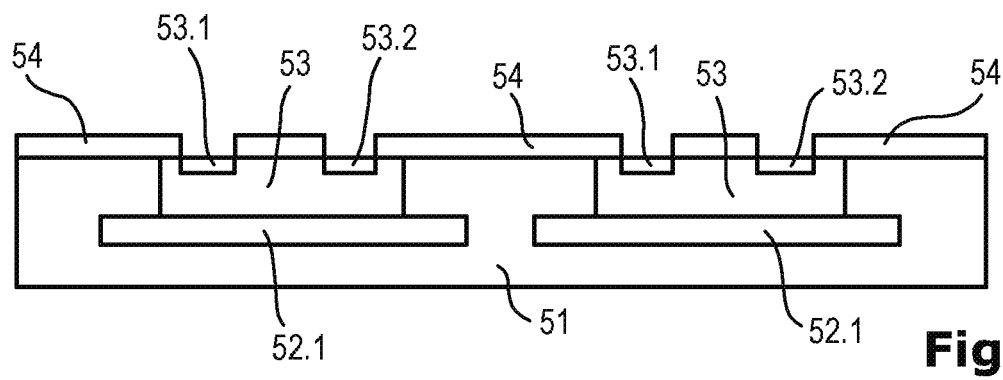

According to FIG. 6E, a dielectric layer 54 is deposited onto the upper main face of the reconstituted wafer, i.e. onto the upper main faces of the RF chips 53 and the encapsulation body 51. The dielectric layer 54 includes openings directly above the contact pads 53.1 and 53.2 of the RF chips 53.

Figure 6F:
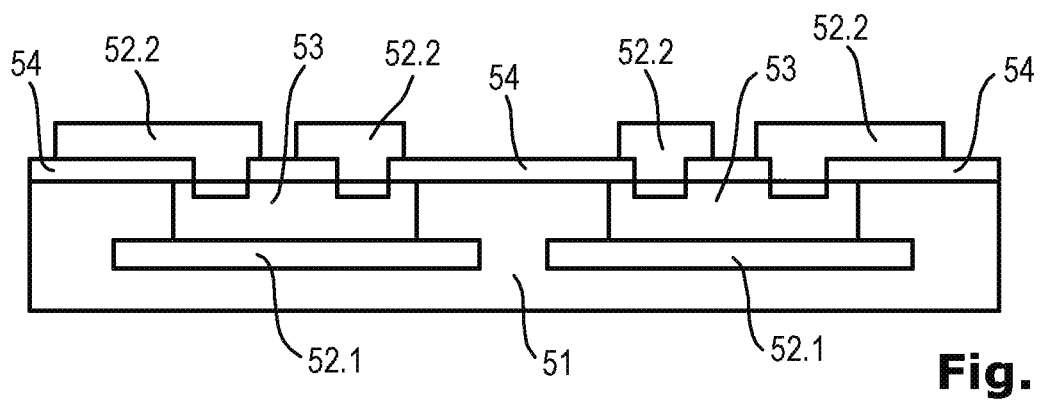

According to FIG. 6F, antenna coils 52.2 are deposited onto the dielectric layer 54 in such a way that each antenna coil 52.2 has a shape as shown in FIG. 5B. The antenna coils 52.2 are deposited, for example, by galvanic plating in which case a seed layer has to be deposited beforehand onto the dielectric layer 54. The antenna coils 52.2 can also be deposited by electroless plating or sputtering. Moreover, the deposition can take place in such a way that, in a first step, a contiguous metallic layer is deposited onto the dielectric layer 54 and afterwards the contiguous layer is structured by means of photo-lithography and etching or, alternatively, a lift-off process is performed or the deposition is carried out through a shadow mask.

Figure 6G:
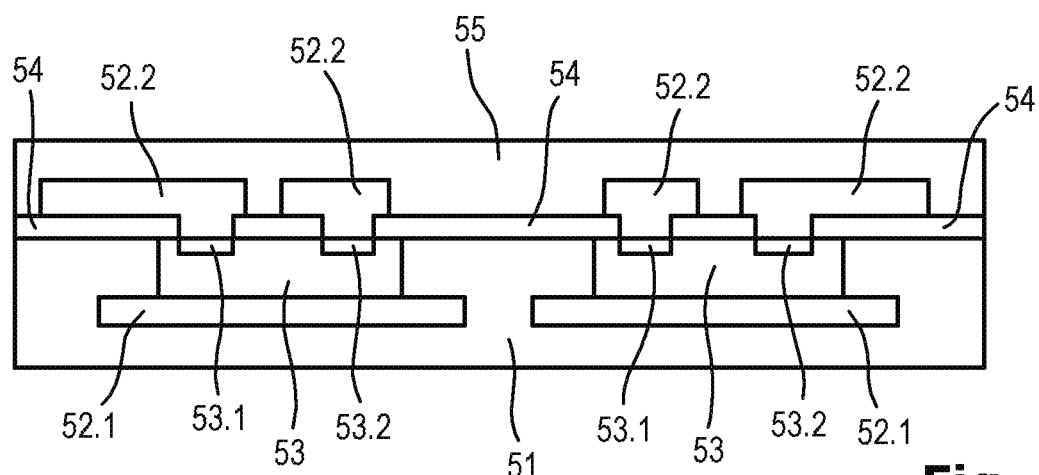

According to FIG. 6G, a second dielectric layer 55 is deposited onto the entire reconstituted wafer.

Figure 6H:
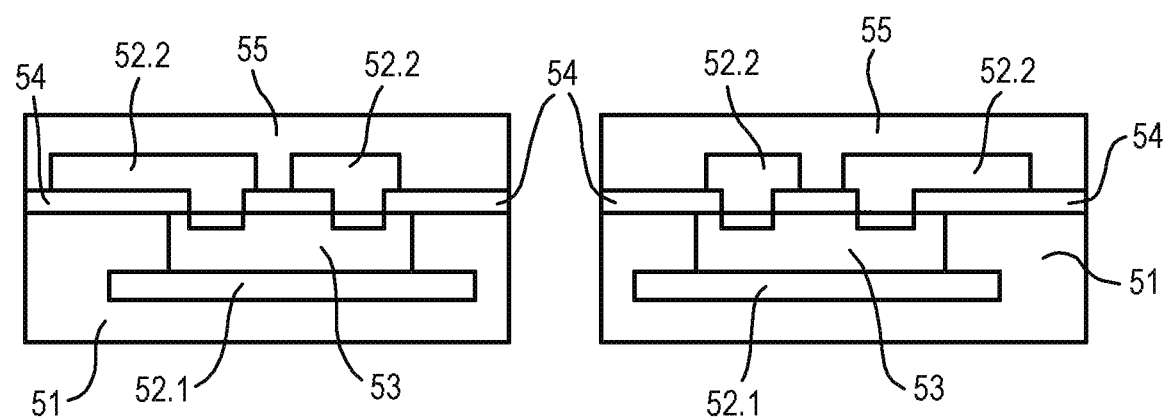

According to FIG. 6H, the reconstituted wafer is singulated to obtain a plurality of electronic device packages.

Figure 7A:
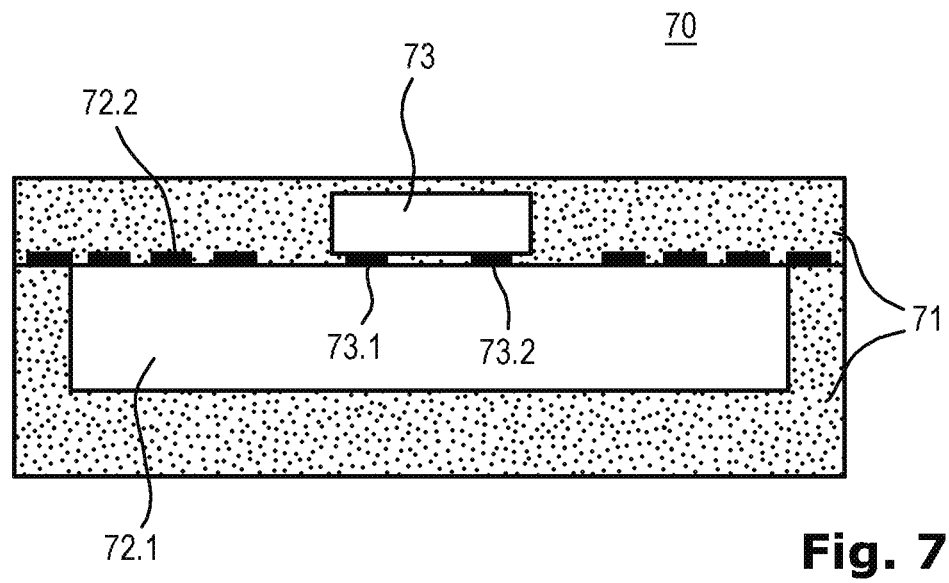
FIGS. 7A and 7B shows schematic cross-sectional side view (A) and perspective (B) representations of a ferrite antenna according to an example.
Figure 7B:
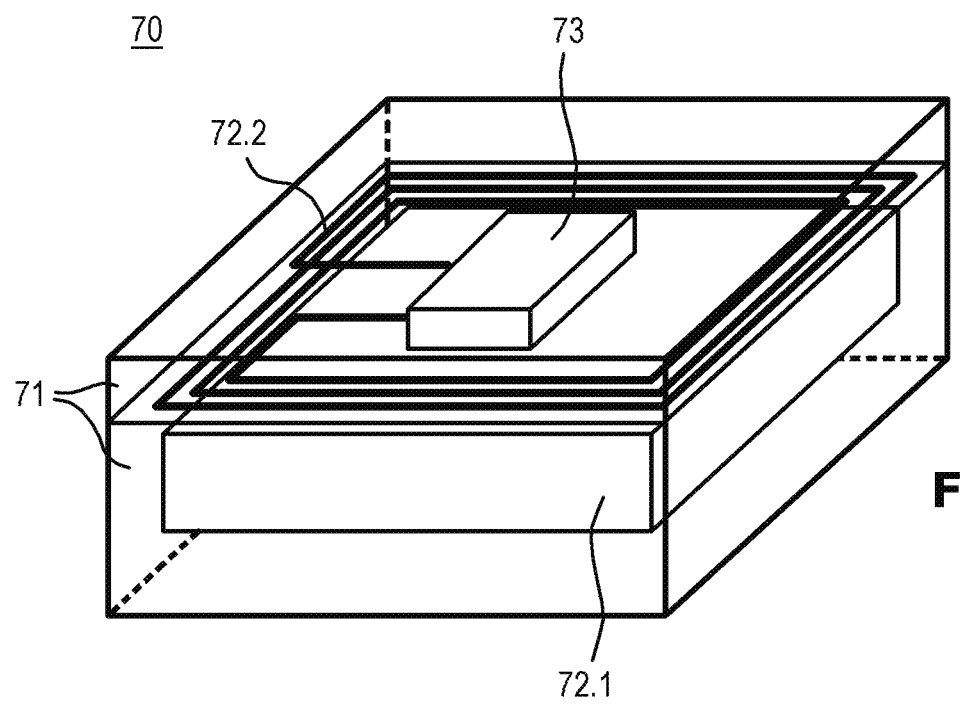

FIG. 7 includes FIGS. 7A and 7B depicting an electronic device package according to an example. The electronic device package 70 includes an encapsulation body 71, and a ferrite antenna 72 disposed in the encapsulation body 71, wherein the ferrite antenna 72 includes a ferrite core 72.1 and an antenna coil 72.2 disposed on the upper main face of the ferrite core 72.1. The electronic device package 70 further includes an RF chip 73 disposed above the ferrite core 72.1, the RF chip 73 including contact pads 73.1 and 73.2 facing the ferrite core 72.1. Each one of the contact pads 73.1 and 73.2 is connected with one end of the antenna coil 72.2.

FIG. 8 includes FIGS. 8A-8H and illustrates a method for fabricating the electronic device package of FIG. 7 according to an example.

Figure 8A:
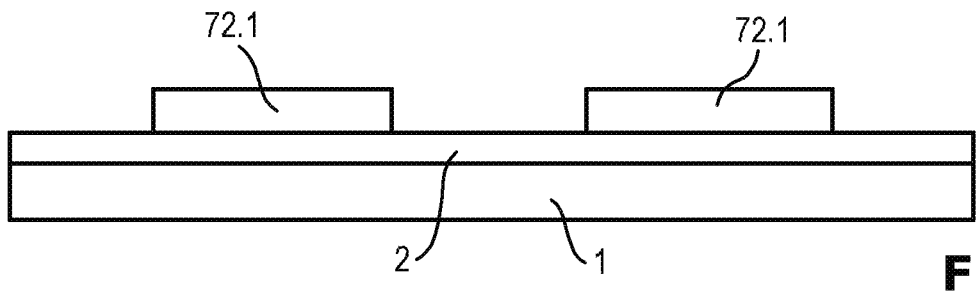
FIGS. 8A-8H shows schematic cross-sectional side view representations for illustrating a method for fabricating a ferrite antenna according to an example.

According to FIG. 8A, a double-sided sticky tape 2 is attached to an auxiliary carrier 1. Then a plurality of ferrite cores 72.1 is attached to the double-sided sticky tape 2 with a main surface thereof and in a certain spatial distance from each other.

Figure 8B:
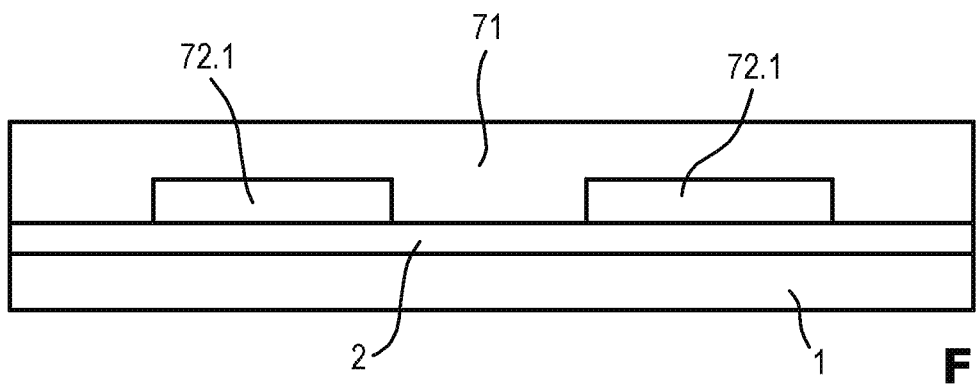

According to FIG. 8B, an encapsulation material 71 is applied to the double-sided sticky tape 2 and the ferrite cores 72.1 so that the ferrite cores 72.1 are embedded in the encapsulation material 71.

Figure 8C:
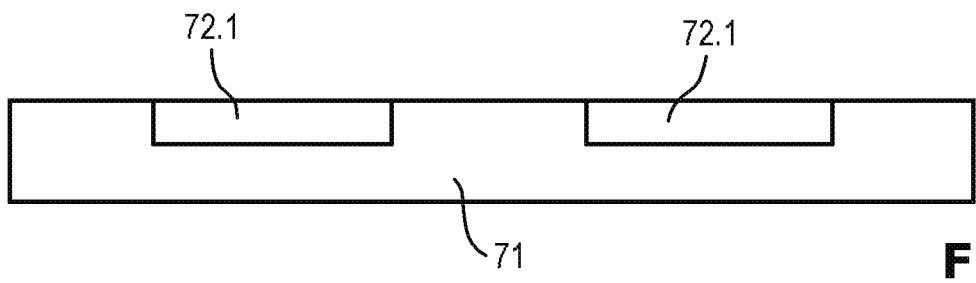

According to FIG. 8C, after hardening of the encapsulation material 71, the double-sided sticky tape 2 and the auxiliary carrier 1 are removed. As a result a reconstituted wafer is obtained in which a plurality of ferrite cores 72.1 are held and stabilized by an encapsulation material 71 such that one of the main faces of the ferrite cores 72.1 is exposed. The resulting panel is shown upside-down in FIG. 8C.

Figure 8D:
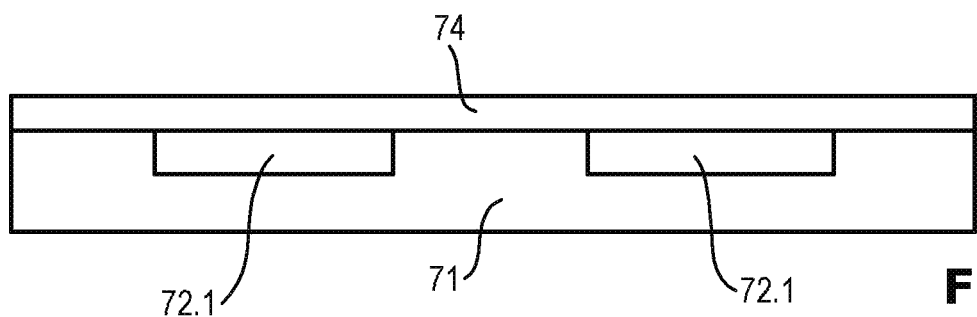

According to FIG. 8D, a first dielectric layer 74 is applied onto the entire upper main face of the reconstituted wafer, i.e. on the exposed upper main faces of the ferrite cores 72.1 and the upper main face of the encapsulation body 71.

Figure 8E:
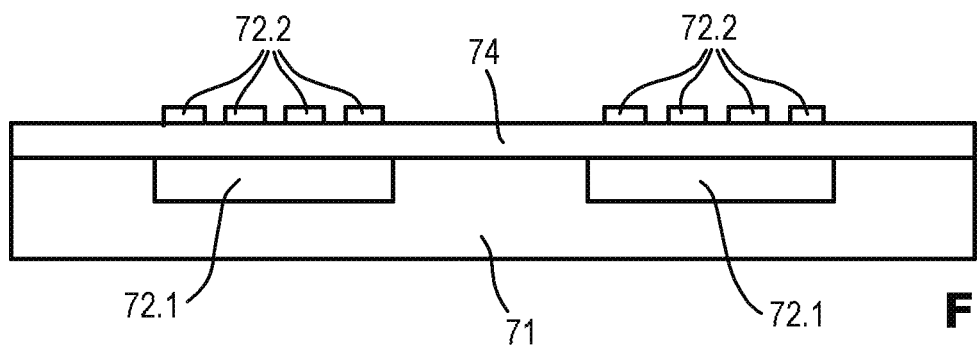

According to FIG. 8E, an antenna coil 72.2 is deposited onto the first dielectric layer 74. The antenna coil 72.2 is formed as shown and explained in connection with FIG. 7B.

Figure 8F:
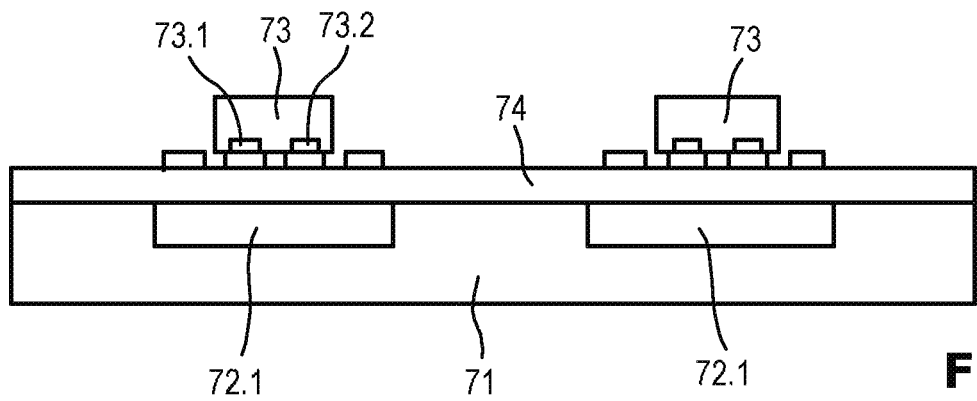

According to FIG. 8F, an RF chip 73 including contact pads 73.1 and 73.2 is placed with its contact pads 73.1 and 73.2 onto two ends of the antenna coil 72.2, respectively.

Figure 8G:
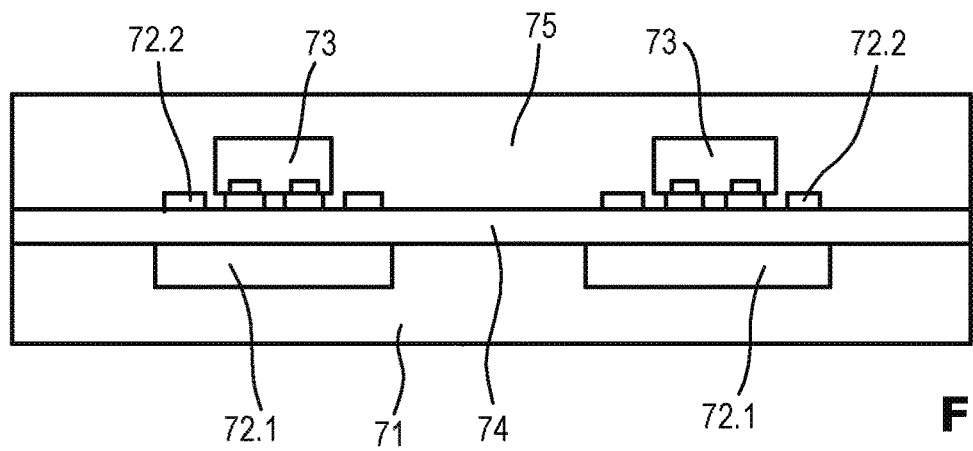

According to FIG. 8G, a second dielectric layer 75 is applied onto the entire surface of the reconstituted wafer, i.e. onto the first dielectric layer 74, the RF chips 73, and the antenna coils 72.2.

Figure 8H:
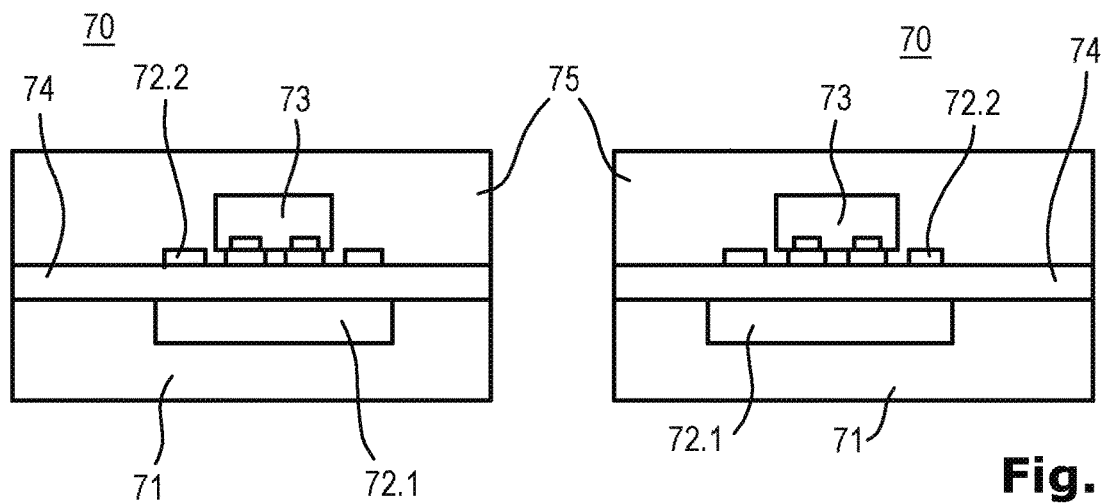

According to FIG. 8H, the reconstituted wafer is singulated to obtain a plurality of electronic device packages 70.

FIG. 9 includes FIGS. 9A-9F and illustrates a method for fabricating an electronic device package.

Figure 9A:
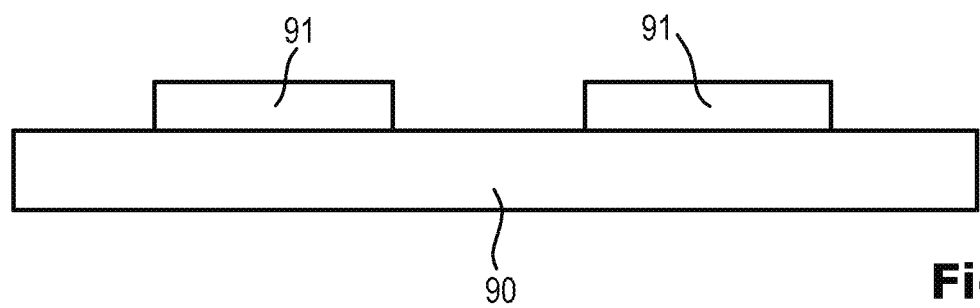
FIGS. 9A-9F shows schematic cross-sectional side view representations for illustrating a method for fabricating a ferrite antenna according to an example.

According to FIG. 9A, a ferrite substrate 90 is provided which can have the form of a wafer or any other quadratic or rectangular shape. Then a plurality of semiconductor chips 91 like, for example, RF chips or RFID chips is attached onto the ferrite substrate 90 with their back surfaces.

Figure 9B:
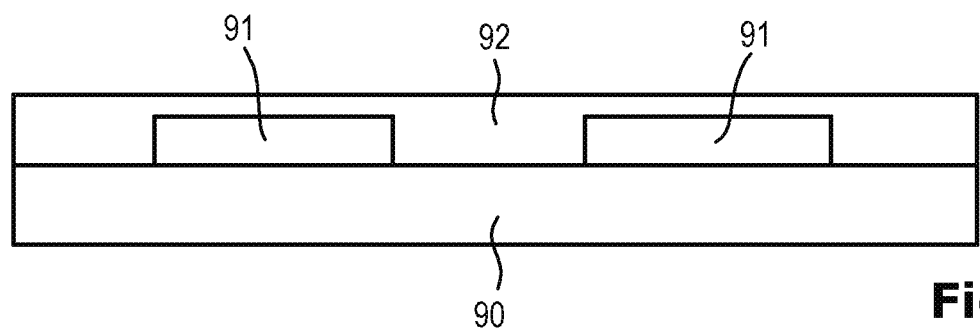

According to FIG. 9B, a first dielectric layer 92 is applied onto the entire surface of the ferrite substrate 90 and the semiconductor chips 91.

Figure 9C:
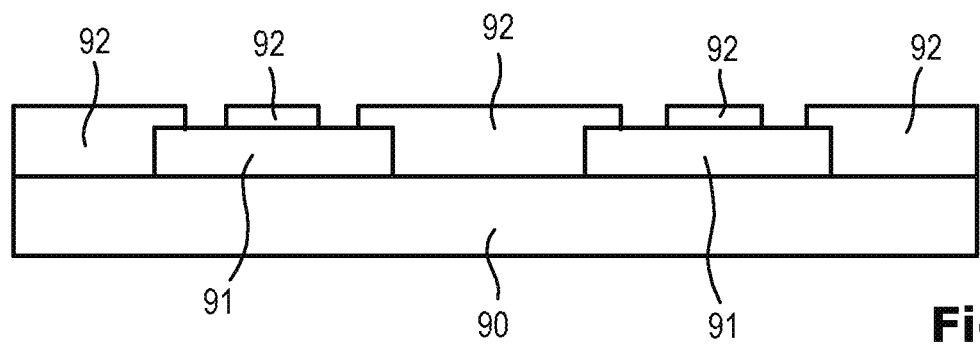

According to FIG. 9C, openings are formed into the first dielectric layer 92 directly above contact pads of the semiconductor chips 91. The openings can, for example, be formed by laser-drilling.

Figure 9D:
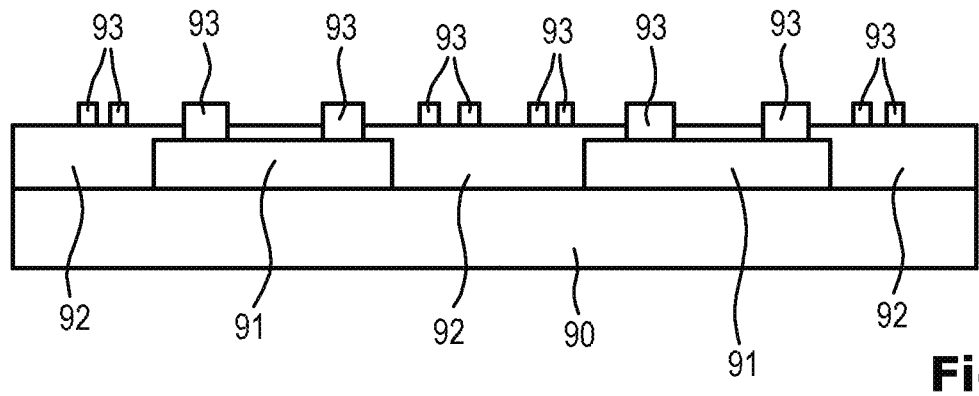
Figure 9E:
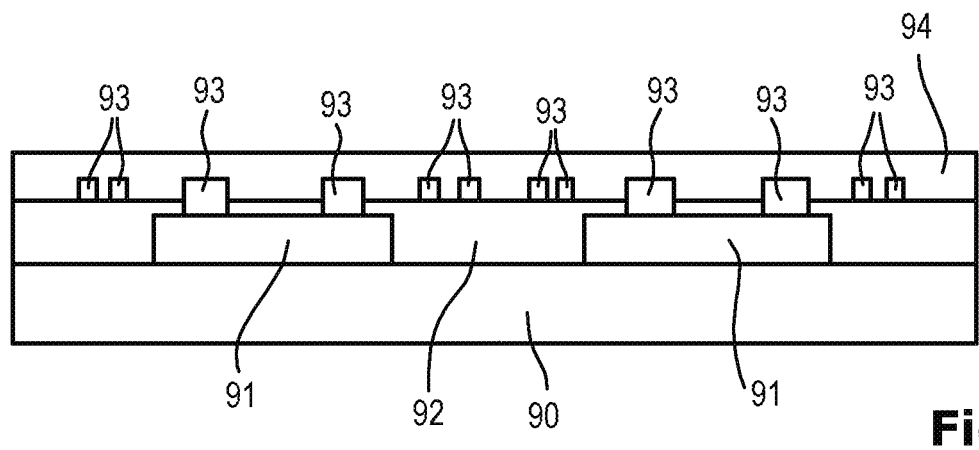

According to FIG. 9D, antenna coils 93 are formed onto the first dielectric layer 92, wherein the antenna coils 93 may look like those depicted in FIG. 5B or FIG. 7B. Electrical contact bars formed directly on electrical contact pads of the semiconductor chips 91 are connected with the respective ends of the antenna coils 93. According to FIG. 9E, a second dielectric layer 94 is applied onto the entire surface of the reconstituted wafer, i.e. onto the first dielectric layer 92 and the antenna coils 93.

Figure 9F:
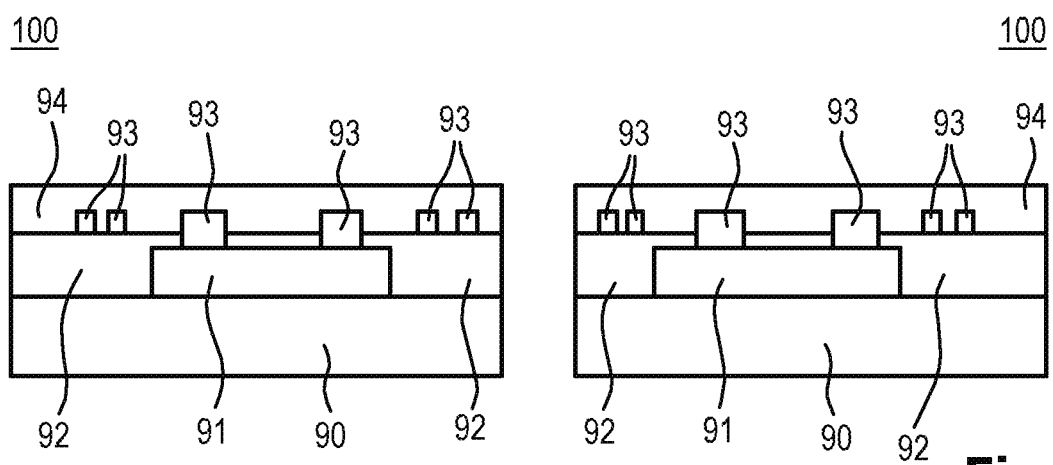

According to FIG. 9F, the reconstituted wafer is singulated to obtain a plurality of electronic device packages 100.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A ferrite antenna, comprising:
    a ferrite core comprising a first main face, a second main face opposite to the first main face, a first side face and a second side face, wherein the first side face and the second side face connect with the first main face and the second main face;
    a first plurality of conductor wires disposed at the first main face of the ferrite core; a second plurality of conductor wires disposed at the second main face of the ferrite core;
    a first encapsulation body disposed at the first side face of the ferrite core, the first encapsulation body comprising a first plurality of connection wires; and
    a second encapsulation body disposed at the second side face of the ferrite core, the second encapsulation body comprising a second plurality of connection wires, the second encapsulation body separate from the first encapsulation body: and
    an encapsulation body disposed over the first main face of the ferrite core, over at least three surfaces of the first encapsulation body and over at least three surfaces of the second encapsulation body:
    wherein the first plurality of conductor wires, the second plurality of conductor wires, the first plurality of connection wires and the second plurality of connection wires are interconnected in such a way that they form an antenna con, wherein the ferrite core is disposed in the interior space of the antenna coil;
    wherein a part of the first plurality of connection wires is not connected with either one of the conductor wires of the first and second plurality of conductor wires, and a part of the second plurality of connection wires is not connected with either one of the conductor wires of the first and second plurality of conductor wires.

2. The ferrite antenna according to claim 1, wherein the first plurality of connection wires are attached to the first encapsulation body and the second plurality of connection wires are attached to the second encapsulation body.

3. The ferrite antenna according to claim 2, wherein the first encapsulation body and the second encapsulation body each comprise an encapsulation material, the encapsulation material comprising one or more of a polymer, a resin, an epoxy-resin, a duroplast, a thermoplast, a ceramic, and a laminate.

4. The ferrite antenna according to claim 2, wherein the first plurality of connection wires are either attached to a surface of the first encapsulation body or the first plurality of connection wires extend through the first encapsulation body, and wherein the second plurality of connection wires are either attached to a surface of the second encapsulation body or the second plurality of connection wires extend through the second encapsulation body.

5. The ferrite antenna according to claim 1, wherein the first encapsulation body and the second encapsulation body are cube-shaped or cuboid-shaped.

6. The ferrite antenna according to claim 1, wherein the first encapsulation body is directly attached to the first side face of the ferrite core, and the second encapsulation body is directly attached to the second side face of the ferrite core.

7. The ferrite antenna according to claim 1, wherein
the first encapsulation body is disposed in a spatial distance from the first side face of the ferrite core, and the second encapsulation body is disposed in a spatial distance from the second side face of the ferrite core.

8. The ferrite antenna according to claim 7, wherein
an intermediate space between the ferrite core and the first encapsulation body and the second encapsulation body is filled with an encapsulation material of the encapsulation body which is equal to or different from an encapsulation material of the first encapsulation body and the second encapsulation body.

9. The ferrite antenna according to claim 1, wherein
each one of the first plurality of conductor wires is connected with one or more than one of the first plurality of connection wires and with one or more than one of the second plurality of connection wires, and wherein each one of the second plurality of conductor wires is connected with one or more than one of the first plurality of connection wires and with one or more than one of the second plurality of connection wires.

10. An electronic device package, comprising: an encapsulation body; and
  a ferrite antenna, wherein the encapsulation body is formed around the ferrite antenna, the ferrite antenna comprising:
  a ferrite core comprising a first main face, a second main face opposite to the first main face, a first side face and a second side face, wherein the first side face and the second side face connect the first main face and the second main face; and
  an antenna coil comprising a first and second plurality of conductor wires and first and second plurality of connection wires, and disposed above one or more of the main faces and the first side face and the second side face of the ferrite core, the antenna coil disposed at the first side face within a first encapsulation body, the antenna coil at the second side face within a second encapsulation body, the second encapsulation body separate from the first encapsulation body,
  wherein the encapsulation body is disposed over the first main face of the ferrite core and over at least three surfaces of the first encapsulation body and over at least three surfaces of the second encapsulation body;
  wherein a part of the first plurality of connection wires is not connected with either one of the conductor wires of the first and second plurality of conductor wires, and a part of the second plurality of connection wires is not connected with either one of the conductor wires of the first and second plurality of conductor wires.

11. The electronic device package according to claim 10, wherein
the antenna coil is disposed above the first main face of the ferrite core and extends only within a plane parallel to the first main face of the ferrite core.

12. The electronic device package according to claim 10, wherein
the ferrite core is disposed in the interior space of the antenna coil.

13. The electronic device package according to claim 10, further comprising:
  at least one semiconductor chip disposed above one of the first or second main faces of the ferrite core.

14. The electronic device package according to claim 13, wherein
the semiconductor chip comprises contact elements, one or more of the contact elements being connected with either one of the conductor wires of the first plurality of conductor wires or the second plurality of conductor wires.

* * * * *

UNITED STATES PATENT AND TRADEMARK OFFICE
CERTIFICATE OF CORRECTION

PATENT NO. : 10,651,898 B2
APPLICATION NO. : 15/184344
DATED : May 12, 2020
INVENTOR(S) : Pachler et al.

It is certified that error appears in the above-identified patent and that said Letters Patent is hereby corrected as shown below:

In the Claims

Column 10, Line 32, Claim 1: delete "antenna con" and insert in place thereof --antenna coil--.

Signed and Sealed this
Twenty-fifth Day of August, 2020

Andrei Iancu
*Director of the United States Patent and Trademark Office*